US008699294B2

(12) United States Patent
Chung

(10) Patent No.: US 8,699,294 B2
(45) Date of Patent: Apr. 15, 2014

(54) NONVOLATILE MEMORY DEVICE

(75) Inventor: Sang Hwa Chung, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 73 days.

(21) Appl. No.: 13/545,444

(22) Filed: Jul. 10, 2012

(65) Prior Publication Data
US 2013/0070541 A1     Mar. 21, 2013

(30) Foreign Application Priority Data

Sep. 21, 2011  (KR) .......................... 10-2011-0095085

(51) Int. Cl.
*G11C 8/00*  (2006.01)

(52) U.S. Cl.
USPC ............ 365/230.06; 365/230.03; 365/230.02; 365/230.04; 365/231

(58) Field of Classification Search
USPC ............. 365/230.06, 230.03, 230.02, 230.04, 365/231
See application file for complete search history.

(56) References Cited

U.S. PATENT DOCUMENTS

| | | | | |
|---|---|---|---|---|
| 5,663,923 A * | 9/1997 | Baltar et al. | ............. | 365/230.03 |
| 5,732,040 A * | 3/1998 | Yabe | ........................ | 365/189.18 |
| 5,774,409 A * | 6/1998 | Yamazaki et al. | ....... | 365/230.03 |
| 5,991,198 A * | 11/1999 | Song et al. | ............... | 365/185.11 |
| 6,256,254 B1 * | 7/2001 | Kwak et al. | .............. | 365/230.03 |
| 6,542,406 B2 * | 4/2003 | Byeon et al. | ............. | 365/185.13 |
| 6,587,375 B2 * | 7/2003 | Chung et al. | ............. | 365/185.13 |
| 6,714,478 B2 * | 3/2004 | Tomita et al. | ............ | 365/230.06 |
| 7,161,842 B2 * | 1/2007 | Park | ......................... | 365/185.33 |
| 7,280,414 B2 * | 10/2007 | Kato | ........................ | 365/189.09 |
| 7,298,665 B2 * | 11/2007 | So et al. | ................... | 365/230.06 |
| 7,315,472 B2 | 1/2008 | Lee | | |
| 7,450,434 B2 * | 11/2008 | Tanuma et al. | .......... | 365/185.29 |
| 7,821,833 B2 * | 10/2010 | Tanuma et al. | .......... | 365/185.13 |
| 8,391,043 B2 * | 3/2013 | Shim et al. | ..................... | 365/63 |
| 8,520,440 B2 * | 8/2013 | Ahn et al. | .................. | 365/185.2 |

FOREIGN PATENT DOCUMENTS

KR     1020130031483      3/2013

* cited by examiner

*Primary Examiner* — Viet Q Nguyen
(74) *Attorney, Agent, or Firm* — IP & T Group LLP

(57) ABSTRACT

A nonvolatile memory device includes a plurality of memory blocks vertically arranged, first and second row decoder groups configured to couple first and second local global word lines and the word lines of upper memory blocks among the plurality of memory blocks, third and fourth row decoder groups configured to couple third and fourth local global word lines and the word lines of lower memory blocks among the plurality of memory blocks, a first local decoder switch configured to couple a plurality of global lines and the first or second local global word lines, a second local decoder switch configured to couple the plurality of global lines and the third or fourth local global word lines, and a high voltage generator configured to supply operating voltages to the plurality of global word lines.

22 Claims, 4 Drawing Sheets

NONVOLATILE MEMORY DEVICE

CROSS-REFERENCE TO RELATED APPLICATION

Priority to Korean patent application number 10-2011-0095085 filed on Sep. 21, 2011, the entire disclosure of which is incorporated by reference herein, is claimed.

BACKGROUND

Exemplary embodiments of the present invention relate to a nonvolatile memory device and, more particularly, to a nonvolatile memory device capable of reducing the size of a pumping capacitor by reducing a load on a high voltage pump.

A nonvolatile memory device uses a plurality of operating voltages, such as a program voltage, a read voltage, an erase voltage, and a pass voltage, during a program operation, a read operation, and an erase operation.

Some of the operating voltages are much higher than an external power supply voltage and generated by raising the external power supply voltage using a pump circuit.

The pump circuit includes a pumping capacitor that occupies a large portion of the area of the pump circuit. The size of the pumping capacitor is determined by the amount of loads of circuits coupled to an output terminal. For example, the loads of the circuits coupled to the output terminal may include a load of global word lines, a load of local word lines, and a load of the junction capacitor of a pass transistor within a row decoder corresponding to each memory block.

FIG. 1 shows the construction of a conventional nonvolatile memory device.

The conventional nonvolatile memory device includes row decoders disposed on both sides of each of planes P0 and P1. In this construction, when one (for example, Block2) of a plurality of blocks within the plane P0 is selected, a high voltage is only to be supplied to local global word lines (for example, LGWL_P0L<65:0>) which are half of the local global word lines LGWL_P0L<65:0> and LGWL_P0R<65:0> corresponding to the plane P0. Accordingly, the output terminal of a high voltage generator 110 is coupled to row decoders which are half of the row decoders corresponding to the plane P0, so that load of the high voltage generator 110 is reduced.

As the degree of integration of nonvolatile memory devices is increased, a load of the high voltage generator 110 is increased. Accordingly, the size of a pumping capacitor forming the high voltage generator is increased.

BRIEF SUMMARY

Exemplary embodiments relate to a nonvolatile memory device in which a plurality of row decoders corresponding to respective memory blocks are disposed on both sides of a plane including the memory blocks, the plurality of row decoders are divided into an upper row decoder group and a lower row decoder group, and local decoder switches correspond to the upper and lower row decoder groups, respectively. In this construction, a load of a high voltage generator may be reduced because the number of row decoders to which a high voltage is supplied is reduced when one of the memory blocks is selected. Accordingly, the size of a pumping capacitor within the high voltage generator may be reduced.

A nonvolatile memory device according to an aspect of the present disclosure includes a plurality of memory blocks vertically arranged, first and second row decoder groups configured to couple first and second local global word lines and word lines of upper memory blocks among the plurality of memory blocks, third and fourth row decoder groups configured to couple third and fourth local global word lines and word lines of lower memory blocks among the plurality of memory blocks, a first local decoder switch configured to couple a plurality of global lines and the first or second local global word lines, a second local decoder switch configured to couple the plurality of global lines and the third or fourth local global word lines, and a high voltage generator configured to supply operating voltages to the plurality of global word lines.

A nonvolatile memory device according to another aspect of the present disclosure includes first and second planes, each comprising a plurality of memory blocks vertically arranged, first to fourth upper row decoder groups disposed on both sides of upper portions of the first and the second planes, respectively, and configured to couple first to fourth upper local global word line groups and word lines of the memory blocks disposed in the upper portions of the first and the second planes, first to fourth lower row decoder groups disposed on both sides of lower portions of the first and the second planes, respectively, and configured to couple first to fourth lower local global word line groups and word lines of the memory blocks disposed in the lower portions of the first and the second planes, an upper local decoder switch configured to couple a plurality of global word lines and one of the first to fourth upper local global word line groups, a lower local decoder switch configured to couple the plurality of global word lines and one of the first to fourth lower local global word line groups, and a high voltage generator configured to supply operating voltages to the plurality of global word lines.

DESCRIPTION OF EMBODIMENTS

Hereinafter, some exemplary embodiments of the present disclosure will be described in detail with reference to the accompanying drawings. The figures are provided to enable those of ordinary skill in the art to make and use the present invention according to the exemplary embodiments of the present invention.

Figure 1:
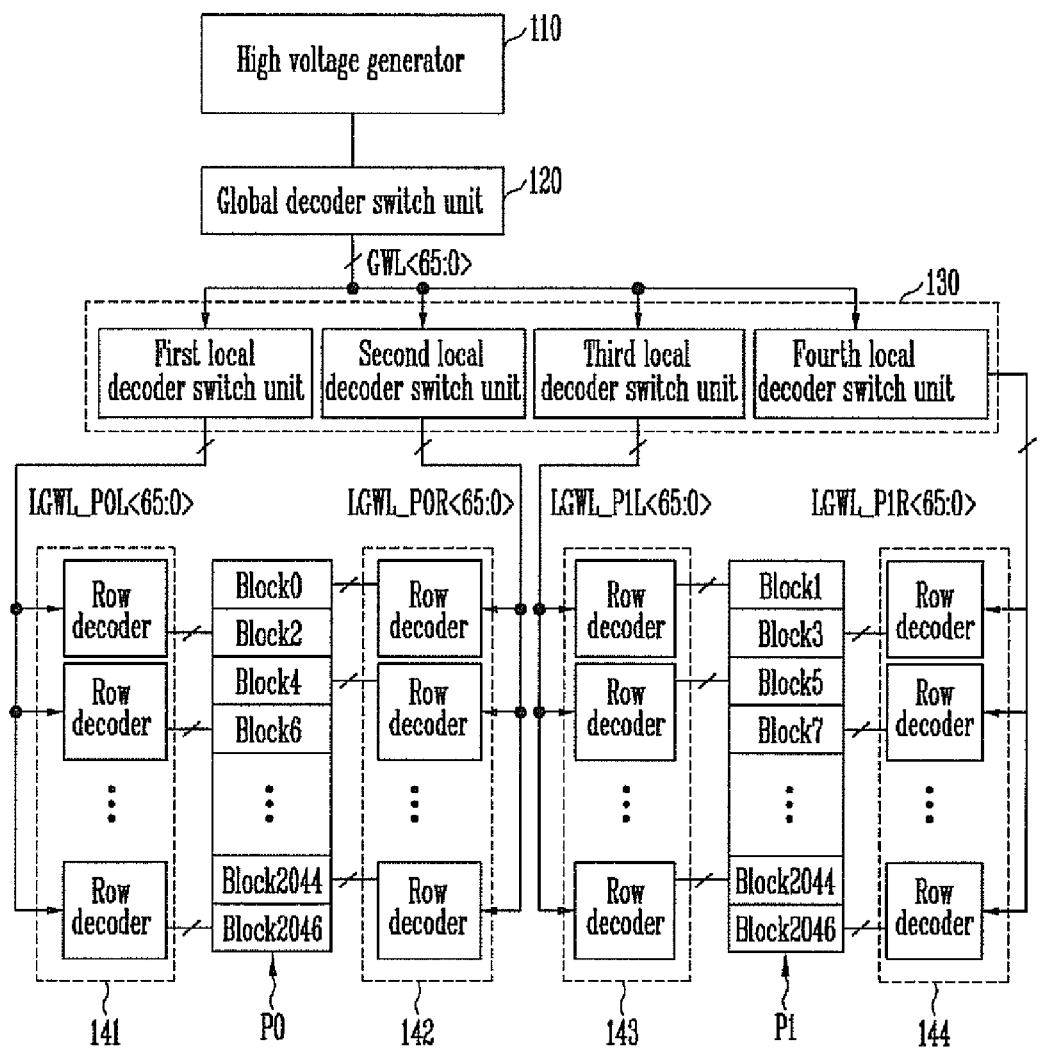
FIG. 1 shows the construction of a conventional nonvolatile memory device.
Figure 2:
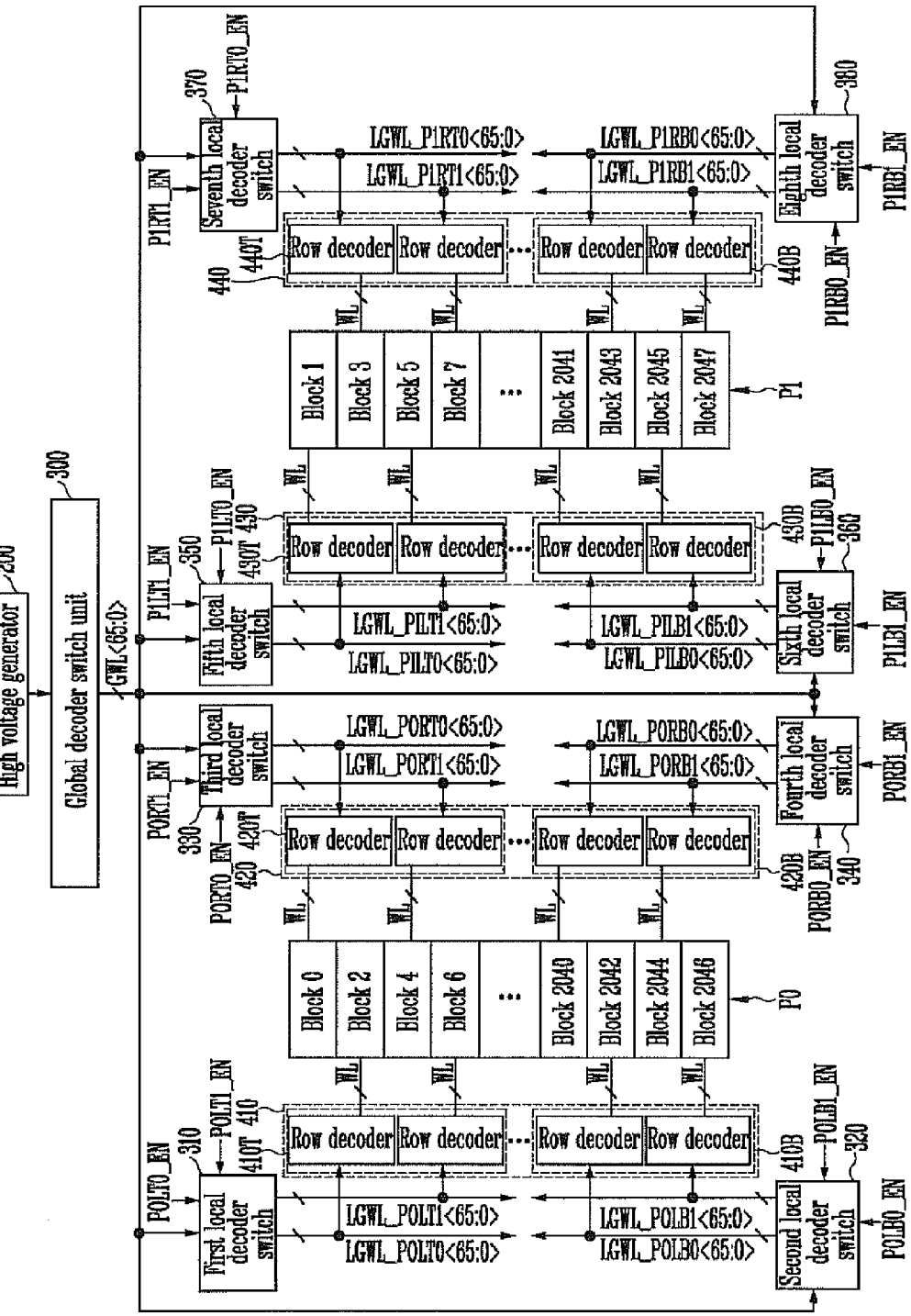
FIG. 2 shows a construction of a nonvolatile memory device according to an exemplary embodiment of the present invention.

FIG. 2 shows a construction of a nonvolatile memory device according to an exemplary embodiment of the present invention.

Referring to FIG. 2, the nonvolatile memory device includes first and second planes P0 and P1, a high voltage generator 200, a global decoder switch unit 300, first to eighth local decoder switches 310 to 380, and first to fourth row decoder groups 410 to 440.

Each of the first and the second planes P0 and P1 includes a plurality of memory blocks which are vertically arranged.

The high voltage generator 200 generates a plurality of operating voltages (for example, a program voltage, a pass voltage, a read voltage, and a verify voltage) for the program operation, the read operation, and the verify operation of the nonvolatile memory device. The high voltage generator 200 includes a plurality of high voltage pump circuits. Each of the high voltage pump circuits includes a pumping capacitor.

The global decoder switch unit 300 selectively supplies a plurality of global word lines GWL<65:0> with the plurality of operating voltages generated from the high voltage generator 200.

The first local decoder switch 310 is coupled between the plurality of global word lines GWL<65:0> and a plurality of first and second upper local global word lines LGWL_P0LT0<65:0> and LGWL_P0LT1<65:0>. The first local decoder switch 310 couples the plurality of first upper local global word lines LGWL_P0LT0<65:0> and the plurality of global word lines GWL<65:0> in response to a first upper enable signal P0LT0_EN or couples the plurality of second upper local global word lines LGWL_P0LT1<65:0> and the plurality of global word lines GWL<65:0> in response to a second upper enable signal P0LT1_EN.

The second local decoder switch 320 is coupled between the plurality of global word lines GWL<65:0> and a plurality of first and second lower local global word lines LGWL_P0LB0<65:0> and LGWL_LB1<65:0>. The second local decoder switch 320 couples the plurality of first lower local global word lines LGWL_P0LB0<65:0> and the plurality of global word lines GWL<65:0> in response to a first lower enable signal P0LB0_EN or couples the plurality of second lower local global word lines LGWL_P0LB1<65:0> and the plurality of global word lines GWL<65:0> in response to a second lower enable signal P0LB1_EN.

The third local decoder switch 330 is coupled between the plurality of global word lines GWL<65:0> and a plurality of third and fourth upper local global word lines LGWL_P0RT0<65:0> and LGWL_P0RT1<65:0>. The third local decoder switch 330 couples the plurality of third upper local global word lines LGWL_P0RT0<65:0> and the plurality of global word lines GWL<65:0> in response to a third upper enable signal P0RT0_EN or couples the plurality of fourth upper local global word lines LGWL_P0RT1<65:0> and the plurality of global word lines GWL<65:0> in response to a fourth upper enable signal P0RT0_EN.

The fourth local decoder switch 340 is coupled between the plurality of global word lines GWL<65:0> and a plurality of third and fourth lower local global word lines LGWL_P0RB0<65:0> and LGWL_P0RB1<65:0>. The fourth local decoder switch 340 couples the plurality of third lower local global word lines LGWL_P0RB0<65:0> and the plurality of global word lines GWL<65:0> in response to a third lower enable signal P0RB0_EN or couples the plurality of fourth lower local global word lines LGWL_P0RB1<65:0> and the plurality of global word lines GWL<65:0> in response to a fourth lower enable signal P0RB0_EN.

The fifth local decoder switch 350 is coupled between the plurality of global word lines GWL<65:0> and a plurality of fifth and sixth upper local global word lines LGWL_P1LT0<65:0> and LGWL_P1LT1<65:0>. The fifth local decoder switch 350 couples the plurality of fifth upper local global word lines LGWL_P1LT0<65:0> and the plurality of global word lines GWL<65:0> in response to a fifth upper enable signal P1LT0_EN or couples the plurality of sixth upper local global word lines LGWL_P1LT1<65:0> and the plurality of global word lines GWL<65:0> in response to a sixth upper enable signal P1LT1_EN.

The sixth local decoder switch 360 is coupled between the plurality of global word lines GWL<65:0> and a plurality of fifth and sixth lower local global word lines LGWL_P1LB0<65:0> and LGWL_P1LB1<65:0>. The sixth local decoder switch 360 couples the plurality of fifth lower local global word lines LGWL_P1LB0<65:0> and the plurality of global word lines GWL<65:0> in response to a fifth lower enable signal P1LB0_EN or couples the plurality of sixth lower local global word lines LGWL_P1LB1<65:0> and the plurality of global word lines GWL<65:0> in response to a sixth lower enable signal P1LB1_EN.

The seventh local decoder switch 370 is coupled between the plurality of global word lines GWL<65:0> and a plurality of seventh and eighth upper local global word lines LGWL_P1RT0<65:0> and LGWL_P1RT1<65:0>. The seventh local decoder switch 370 couples the plurality of seventh upper local global word lines LGWL_P1RT0<65:0> and the plurality of global word lines GWL<65:0> in response to a seventh upper enable signal P1RT0_EN or couples the plurality of eighth upper local global word lines LGWL_P1RT1<65:0> and the plurality of global word lines GWL<65:0> in response to an eighth upper enable signal P1RT1_EN.

The eighth local decoder switch 380 is coupled between the plurality of global word lines GWL<65:0> and a plurality of seventh and eighth lower local global word lines LGWL_P1RB0<65:0> and LGWL_P1RB1<65:0>. The eighth local decoder switch 380 couples the plurality of seventh lower local global word lines LGWL_P1RB0<65:0> and the plurality of global word lines GWL<65:0> in response to a seventh lower enable signal P1RB0_EN or couples the plurality of eighth lower local global word lines LGWL_P1RB1<65:0> and the plurality of global word lines GWL<65:0> in response to an eighth lower enable signal P1RB1_EN.

The first and the second row decoder groups 410 and 420 are disposed on both sides of the first plane P0. The first row decoder group 410 corresponds to even-numbered memory blocks Block2, Block6, . . . , Block2042, and Block2046, among the plurality of memory blocks included in the first plane P0. The second row decoder group 420 corresponds to odd-numbered memory blocks Block0, Block4, . . . , Block2040, and Block2044, among the plurality of memory blocks included in the first plane P0.

The first row decoder group 410 is divided into a first upper row decoder group 410T and a first lower row decoder group 410B. The second row decoder group 420 is divided into a second upper row decoder group 420T and a second lower row decoder group 420B.

Odd-numbered row decoders of the row decoders included in the first upper row decoder group 410T are coupled to the plurality of first upper local global word lines LGWL_P0LT0<65:0>. Even-numbered row decoders of the row decoders included in the first upper row decoder group 410T are coupled to the plurality of second upper local global word lines LGWL_P0LT1<65:0>.

Odd-numbered row decoders of the row decoders included in the first lower row decoder group 410B are coupled to the plurality of first lower local global word lines LGWL_P0LB0<65:0>. Even-numbered row decoders of the row decoders included in the first lower row decoder group 4106 are coupled to the plurality of second lower local global word lines LGWL_P0LB1<65:0>.

Odd-numbered row decoders of the row decoders included in the second upper row decoder group 420T are coupled to the plurality of third upper local global word lines LGWL_P0RT0<65:0>. Even-numbered row decoders of the row decoders included in the second upper row decoder group 420T are coupled to the plurality of fourth upper local global word lines LGWL_P0RT1<65:0>.

Odd-numbered row decoders of the row decoders included in the second lower row decoder group 420B are coupled to the plurality of third lower local global word lines LGWL_P0RB0<65:0>. Even-numbered row decoders of the row decoders included in the second lower row decoder group 420B are coupled to the plurality of fourth lower local global word lines LGWL_P0RB1<65:0>.

The third and the fourth row decoder groups 430 and 440 are disposed on both sides of the second plane P1. The third row decoder group 430 corresponds to odd-numbered memory blocks Block1, Block5, . . . , Block2041, and Block2045, among the plurality of memory blocks included in the second plane P1. The fourth row decoder group 440 corresponds to even-numbered memory blocks Block3, Block7, . . . , Block2043, and Block2047, among the plurality of memory blocks included in the second plane P1.

The third row decoder group 430 is divided into a third upper row decoder group 430T and a third lower row decoder group 430B. The fourth row decoder group 440 is divided into a fourth upper row decoder group 440T and a fourth lower row decoder group 440B.

Odd-numbered row decoders of the row decoders included in the third upper row decoder group 430T are coupled to the plurality of fifth upper local global word lines LGWL_P1LT0<65:0>. Even-numbered row decoders of the row decoders included in the third upper row decoder group 430T are coupled to the plurality of sixth upper local global word lines LGWL_P1LT1<65:0>.

Odd-numbered row decoders of the row decoders included in the third lower row decoder group 430B are coupled to the plurality of fifth lower local global word lines LGWL_P1LB0<65:0>. Even-numbered row decoders of the row decoders included in the third lower row decoder group 430B are coupled to the plurality of sixth lower local global word lines LGWL_P1LB1<65:0>.

Odd-numbered row decoders of the row decoders included in the fourth upper row decoder group 440T are coupled to the plurality of seventh upper local global word lines LGWL_P1RT0<65:0>. Even-numbered row decoders of the row decoders included in the fourth upper row decoder group 440T are coupled to the plurality of eighth upper local global word lines LGWL_P1RT1<65:0>.

Odd-numbered row decoders of the row decoders included in the fourth lower row decoder group 440B are coupled to the plurality of seventh lower local global word lines LGWL_P1RB0<65:0>. Even-numbered row decoders of the row decoders included in the fourth lower row decoder group 440B are coupled to the plurality of eighth lower local global word lines LGWL_P1RB1<65:0>.

The plurality of row decoders of the first to fourth row decoder groups 410 to 440 includes pass transistors for coupling the local global word lines and the respective word lines of a memory block.

In accordance with an embodiment of the present invention, the output terminal of the high voltage generator 200 is coupled to the plurality of global word lines GWL<65:0> through the global decoder switch unit 300. The plurality of global word lines GWL<65:0> are coupled to one group of local global word lines of the first to eighth upper local global word lines and the first to eighth lower local global word lines through one local decoder switch, enabled from among the first to eighth local decoder switches. Consequently, the output terminal of the high voltage generator 200 is coupled to only the upper or lower row decoder group of the one selected from among the first to fourth row decoder groups including the plurality of row decoders corresponding to all the memory blocks. Accordingly, a total load of the high voltage generator 200 is reduced, for example, up to ⅛ of the load of the conventional generator.

$$Cpump = Iout \times (\Delta tCLK / \Delta VCLK)$$

$$Iout = Cload \times (\Delta V / \Delta t)$$

The above equations are used to determine the size of each of the pumping capacitors Cpump included in the high voltage generator 200. Referring to the first equation, when a pumping clock tCLK and a pumping clock voltage VCLK are fixed values, the size of the pumping capacitor Cpump may be reduced if a pump output current Iout is reduced. Referring to the second equation, the pump output current Iout may be reduced by reducing a pump output load Cload (V: a pump output voltage, t: a pump output rising time). Accordingly, the size of the pumping capacitor included in the high voltage generator 200 may be reduced by reducing the load value of the high voltage generator 200, so that the area of the nonvolatile memory device is reduced.

Figure 3:
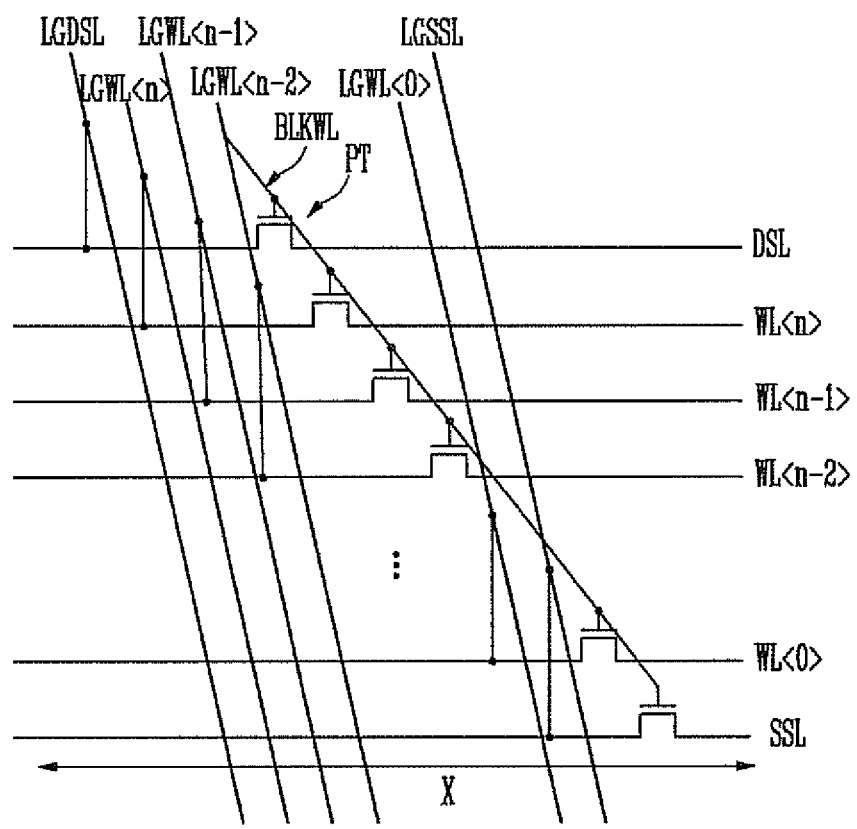
FIG. 3 shows a construction of a plurality of global word lines and a plurality of local global word lines which are arranged over row decoders according to an exemplary embodiment of the present invention.

FIG. 3 shows a construction the plurality of global word lines and the plurality of local global word lines which are arranged over the row decoders according to an exemplary embodiment of the present invention.

Referring to FIG. 3, a plurality of global lines LGDSL, LGWL<n:0>, and LGSSL and the plurality of word lines WL are coupled through a plurality of pass transistors PT of the row decoder. As a device size is reduced in a nonvolatile memory device, the length of a string within a memory block is shortened. However, the pass transistors within the row decoder are formed of high voltage transistors and it is difficult to reduce the width of the pass transistor in proportional to the shortened string. Accordingly, an area occupied by the pass transistors becomes great as compared with the size of the string. For this reason, the pass transistors are obliquely disposed one another as shown in FIG. 3 in order to prevent the pass transistors from overlapping with one another. If the pass transistors are obliquely disposed, however, the total length X of the pass transistors in the direction of the word lines is increased. Accordingly, in an exemplary embodiment of the present invention, although the number of local global word lines is increased, a space where the local global word lines are disposed may be secured because the horizontal length X of the row decoder is increased due to a reduction of a device size. That is, all the local global word lines may be disposed over the row decoder in the direction of bit lines.

Figure 4:
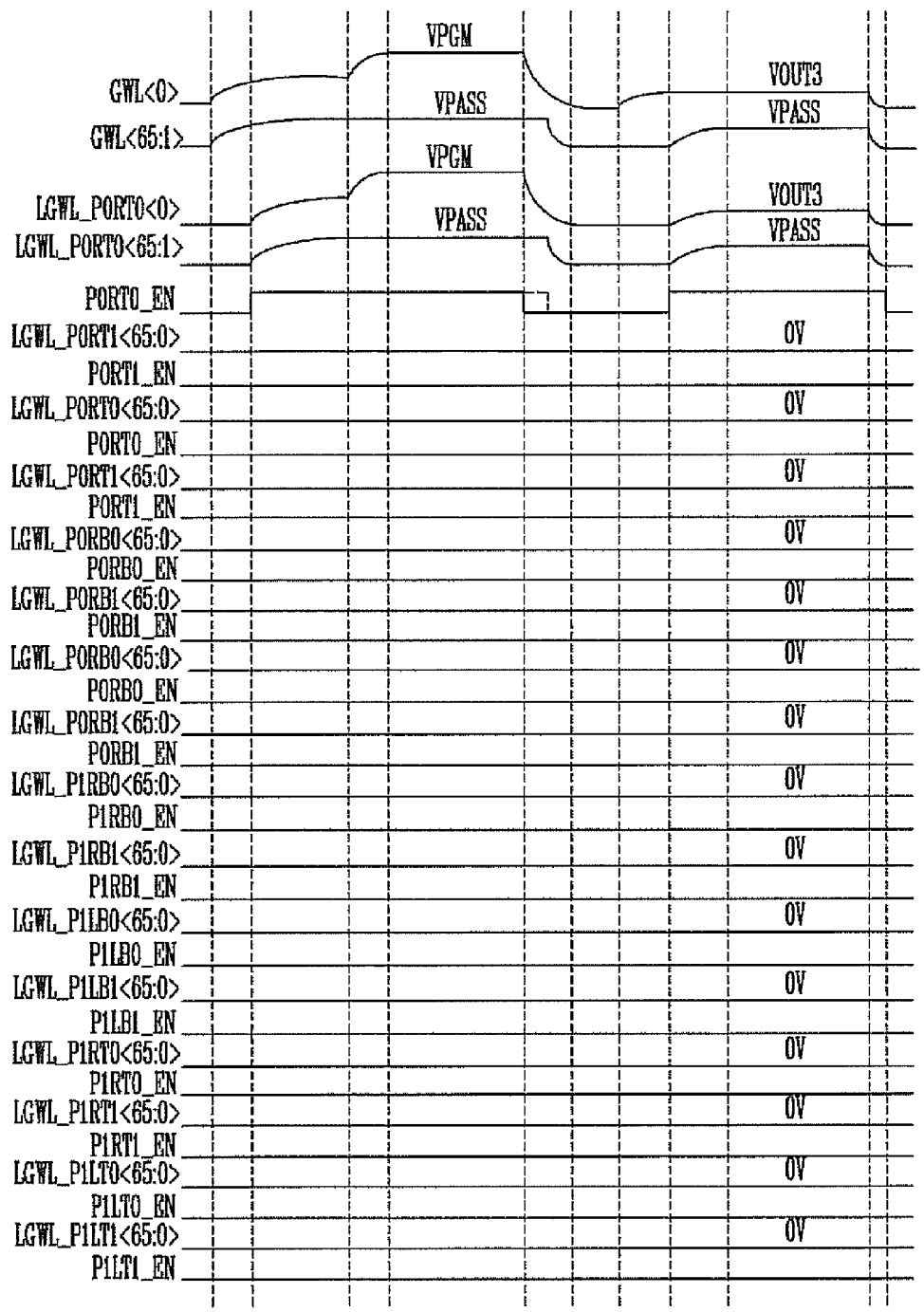
FIG. 4 shows waveforms illustrating an operation of the nonvolatile memory device according to an exemplary embodiment of the present invention.

FIG. 4 shows waveforms illustrating an operation of the nonvolatile memory device according to an exemplary embodiment of the present invention.

The operation of the nonvolatile memory device according to the exemplary embodiment of the present invention is described below with reference to FIGS. 2 and 4.

In the operation of the present invention, it is described as an exemplary embodiment that the second block Block2 is selected from among the memory blocks of the first plane P0 and a program voltage VPGM is supplied to a 0th word line of the second block Block2 in a program operation.

The high voltage generator 200 generates the program voltage VPGM and a pass voltage VPASS in the program operation.

The generated program voltage VPGM is supplied to the global word line GWL<0> of the plurality of global word lines GWL<65:0>, and the pass voltage VPASS is supplied to the remaining global word lines GWL<65:1>. The first local decoder switch 310 couples the plurality of global word lines GWL<65:0> and the plurality of first upper local global word lines LGWL_P0LT0<65:0> in response to the first upper enable signal P0LT0_EN. Thus, the program voltage VPGM and the pass voltage VPASS are supplied to the row decoders of the first upper row decoder group 410T. At this time, the second to eighth local decoder switches 320 to 380 are disabled.

A row decoder corresponding to the second memory block Block2, among the row decoders included in the first upper row decoder group 410T, transfers the program voltage VPGM and the pass voltage VPASS, received via the plurality of first upper local global word lines LGWL_P0LT0<65:0>, to the word lines of the second memory block Block2.

In a read operation, the high voltage generator 200 generates a read voltage VOUT and the pass voltage VPASS. For example, only the first local decoder switch 310 is enabled as in the program operation, and thus the plurality of first upper local global word lines LGWL_P0LT0<65:0> and the plurality of global word lines GWL<65:0> are coupled. A row decoder corresponding to the second memory block Block2, among the row decoders included in the first upper row decoder group 410T, transfers the read voltage VOUT and the pass voltage VPASS, received via the plurality of first upper local global word lines LGWL_P0LT0<65:0>, to the word lines of the second memory block Block2.

In accordance with the exemplary embodiment of the present invention, the plurality of row decoders corresponding to the respective memory blocks are disposed on both sides of each plane including a plurality of memory blocks, the plurality of row decoders are divided into the upper row decoder group and the lower row decoder group, and the local decoder switches correspond to the upper and lower row decoder groups, respectively. Accordingly, a load of the high voltage generator may be reduced because the number of row decoders to which a high voltage is supplied is reduced when one of the memory blocks is selected. Accordingly, the size of a pumping capacitor within the high voltage generator may be reduced.

What is claimed is:

1. A nonvolatile memory device, comprising:
   a plurality of memory blocks vertically arranged;
   first and second row decoder groups configured to couple first and second local global word lines and word lines of upper memory blocks among the plurality of memory blocks;
   third and fourth row decoder groups configured to couple third and fourth local global word lines and word lines of lower memory blocks among the plurality of memory blocks;
   a first local decoder switch configured to couple a plurality of global lines and the first or second local global word lines;
   a second local decoder switch configured to couple the plurality of global lines and the third or fourth local global word lines; and
   a high voltage generator configured to supply operating voltages to the plurality of global word lines.

2. The nonvolatile memory device of claim 1, wherein the high voltage generator is coupled to the group of the first to fourth local global word lines through the plurality of global word lines.

3. The nonvolatile memory device of claim 1, wherein the plurality of global word lines and the first and the second local global word lines are arranged over the first and the second row decoder groups, and the plurality of global word lines and the third and the fourth local global word lines are arranged over the third and the fourth row decoder groups.

4. The nonvolatile memory device of claim 1, wherein the first local decoder switch comprises:
   a first decoder switch configured to couple the plurality of global word lines and the first local global word lines; and
   a second decoder switch configured to couple the plurality of global word lines and the second local global word lines.

5. The nonvolatile memory device of claim 4, wherein the first decoder switch is configured to couple the plurality of global word lines and first local global word lines corresponding to odd-numbered row decoders of the first row decoder group, among the first local global word lines, in response to a first enable signal and couple the plurality of global word lines and first local global word lines corresponding to even-numbered row decoders of the first row decoder group, among the first local global word lines, in response to a second enable signal.

6. The nonvolatile memory device of claim 4, wherein the second decoder switch is configured to couple the plurality of global word lines and second local global word lines corresponding to odd-numbered row decoders of the second row decoder group, among the second local global word lines, in response to a first enable signal, and couple the plurality of global word lines and second local global word lines corresponding to even-numbered row decoders of the second row decoder group, among the second local global word lines, in response to a second enable signal.

7. The nonvolatile memory device of claim 1, wherein the second local decoder switch comprises:
   a third decoder switch configured to couple the plurality of global word lines and the third local global word lines; and
   a fourth decoder switch configured to couple the plurality of global word lines and the fourth local global word lines.

8. The nonvolatile memory device of claim 7, wherein the third decoder switch is configured to couple the plurality of global word lines and third local global word lines corresponding to odd-numbered row decoders of the third row decoder group, among the third local global word lines, in response to a first enable signal, and couple the plurality of global word lines and third local global word lines corresponding to even-numbered row decoders of the third row decoder group, among the third local global word lines, in response to a second enable signal.

9. The nonvolatile memory device of claim 7, wherein the fourth decoder switch is configured to couple the plurality of global word lines and fourth local global word lines corresponding to odd-numbered row decoders of the fourth row decoder group, among the fourth local global word lines, in response to a first enable signal, and couple the plurality of global word lines and fourth local global word lines corresponding to even-numbered row decoders of the fourth row decoder group, among the fourth local global word lines, in response to a second enable signal.

10. A nonvolatile memory device, comprising:
    first and second planes, each comprising a plurality of memory blocks vertically arranged;
    first to fourth upper row decoder groups disposed on both sides of upper portions of the first and the second planes, respectively, and configured to couple first to fourth upper local global word line groups and word lines of the memory blocks disposed in the upper portions of the first and the second planes;
    first to fourth lower row decoder groups disposed on both sides of lower portions of the first and the second planes, respectively, and configured to couple first to fourth lower local global word line groups and word lines of the memory blocks disposed in the lower portions of the first and the second planes;

an upper local decoder switch configured to couple a plurality of global word lines and one of the first to fourth upper local global word line groups;

a lower local decoder switch configured to couple the plurality of global word lines and one of the first to fourth lower local global word line groups; and a high voltage generator configured to supply operating voltages to the plurality of global word lines.

11. The nonvolatile memory device of claim 10, wherein the high voltage generator is coupled to one of the first to fourth upper local global word line groups and the first to fourth lower local global word line groups through the plurality of global word lines.

12. The nonvolatile memory device of claim 10, wherein the plurality of global word lines and the first to fourth upper local global word line groups are disposed over the first to fourth upper row decoder groups, and the plurality of global word lines and the first to fourth lower local global word line groups are disposed over the first to fourth lower row decoder groups.

13. The nonvolatile memory device of claim 10, wherein the upper local decoder switch comprises:
    a first local decoder switch configured to couple the plurality of global word lines and the first upper local global word line group;
    a second local decoder switch configured to couple the plurality of global word lines and the second upper local global word line group;
    a third local decoder switch configured to couple the plurality of global word lines and the third upper local global word line group; and
    a fourth local decoder switch configured to couple the plurality of global word lines and the fourth upper local global word line group.

14. The nonvolatile memory device of claim 13, wherein the first local decoder switch is configured to
    couple the plurality of global word lines and upper local global word lines of the first upper local global word line group, corresponding to odd-numbered row decoders of the first upper row decoder group, in response to a first enable signal and couple the plurality of global word lines and upper local global word lines of the first upper local global word line group, corresponding to even-numbered row decoders of the first upper row decoder group, in response to a second enable signal.

15. The nonvolatile memory device of claim 13, wherein the second local decoder switch is configured to couple the plurality of global word lines and upper local global word lines of the second upper local global word line group, corresponding to odd-numbered row decoders of the second upper row decoder group, in response to a first enable signal and couple the plurality of global word lines and upper local global word lines of the second upper local global word line group, corresponding to even-numbered row decoders of the second upper row decoder group, in response to a second enable signal.

16. The nonvolatile memory device of claim 13, wherein the third local decoder switch is configured to couple the plurality of global word lines and upper local global word lines of the third upper local global word line group, corresponding to even-numbered row decoders of the third upper row decoder group, in response to a first enable signal and couple the plurality of global word lines and upper local global word lines of the third upper local global word line group, corresponding to odd-numbered row decoders of the third upper row decoder group, in response to a second enable signal.

17. The nonvolatile memory device of claim 13, wherein the fourth local decoder switch is configured to couple the plurality of global word lines and upper local global word lines of the fourth upper local global word line group, corresponding to even-numbered row decoders of the fourth upper row decoder group, in response to a first enable signal and couple the plurality of global word lines and upper local global word lines of the fourth upper local global word line group, corresponding to odd-numbered row decoders of the fourth upper row decoder group, in response to a second enable signal.

18. The nonvolatile memory device of claim 10, wherein the lower local decoder switch comprises:
    a fifth local decoder switch configured to couple the plurality of global word lines and the first lower local global word line group;
    a sixth local decoder switch configured to couple the plurality of global word lines and the second lower local global word line group;
    a seventh local decoder switch configured to couple the plurality of global word lines and the third lower local global word line group; and
    an eighth local decoder switch configured to couple the plurality of global word lines and the fourth lower local global word line group.

19. The nonvolatile memory device of claim 18, wherein the fifth local decoder switch is configured to couple the plurality of global word lines and lower local global word lines of the first lower local global word line group, corresponding to odd-numbered row decoders of the first lower row decoder group, in response to a first enable signal and couple the plurality of global word lines and lower local global word lines of the first lower local global word line group, corresponding to even-numbered row decoders of the first lower row decoder group, in response to a second enable signal.

20. The nonvolatile memory device of claim 18, wherein the sixth local decoder switch is configured to couple the plurality of global word lines and lower local global word lines of the second lower local global word line group, corresponding to odd-numbered row decoders of the second lower row decoder group, in response to a first enable signal and couple the plurality of global word lines and lower local global word lines of the second lower local global word line group, corresponding to even-numbered row decoders of the second lower row decoder group, in response to a second enable signal.

21. The nonvolatile memory device of claim 18, wherein the seventh local decoder switch is configured to couple the plurality of global word lines and lower local global word lines of the third lower local global word line group, corresponding to even-numbered row decoders of the third lower row decoder group, in response to a first enable signal and couple the plurality of global word lines and lower local global word lines of the third lower local global word line group, corresponding to odd-numbered row decoders of the third lower row decoder group, in response to a second enable signal.

22. The nonvolatile memory device of claim 18, wherein the eighth local decoder switch is configured to couple the plurality of global word lines and lower local global word lines of the fourth lower local global word line group, corresponding to even-numbered row decoders of the fourth lower row decoder group, in response to a first enable signal and couple the plurality of global word lines and lower local global word lines of the fourth lower local global word line group, corresponding to odd-numbered row decoders of the fourth lower row decoder group, in response to a second enable signal.

* * * * *